United States Patent [19]

Valek

[11] 4,219,801
[45] Aug. 26, 1980

[54] DUAL SLIDE SWITCH VOLTAGE ENCODER

[75] Inventor: Robert J. Valek, Wheaton, Ill.

[73] Assignee: Motorola, Inc., Schaumburg, Ill.

[21] Appl. No.: 920,050

[22] Filed: Jun. 28, 1978

[51] Int. Cl.$^2$ .......................................... H03K 13/02
[52] U.S. Cl. .......................................... 340/347 DA
[58] Field of Search ................. 340/347 DA; 323/79, 323/80, 96

[56] References Cited

U.S. PATENT DOCUMENTS

| | | | |
|---|---|---|---|
| 2,988,737 | 6/1961 | Schroeder | 340/347 DA |
| 3,044,007 | 7/1962 | Akers | 340/347 DA |

OTHER PUBLICATIONS

Bachmann, "IBM Technical Disclosure Bulletin", vol. 9, No. 10, Mar. 1967, p. 1330.
Timko, "Electronic Design", 20, Sep. 27, 1978, pp. 68–76.
Schulein, "Electronics", Mar. 4, 1976, p. 123.

Primary Examiner—Charles D. Miller
Attorney, Agent, or Firm—James W. Gillman; Melvin A. Klein; Phillip H. Melamed

[57] ABSTRACT

A dual slide switch voltage encoder is provided in which a plurality of analog voltages are produced as output signals of the encoder at a single output terminal. Two three position slide switches having manual actuators are utilized to provide a series of nine different analog output voltages having substantially equal increments in magnitude therebetween. A reference voltage from a microprocessor is utilized to develop these analog output voltages which are subsequently fed into an analog to digital converter in the microprocessor. Thus the present invention utilizes two three position slide switches to create a series of analog voltages having equal increments in magnitude therebetween wherein each of these analog voltages represents a different logic state corresponding to a specific combination of the various possible mechanical positions of the manual actuators of the two three position slide switches.

17 Claims, 1 Drawing Figure

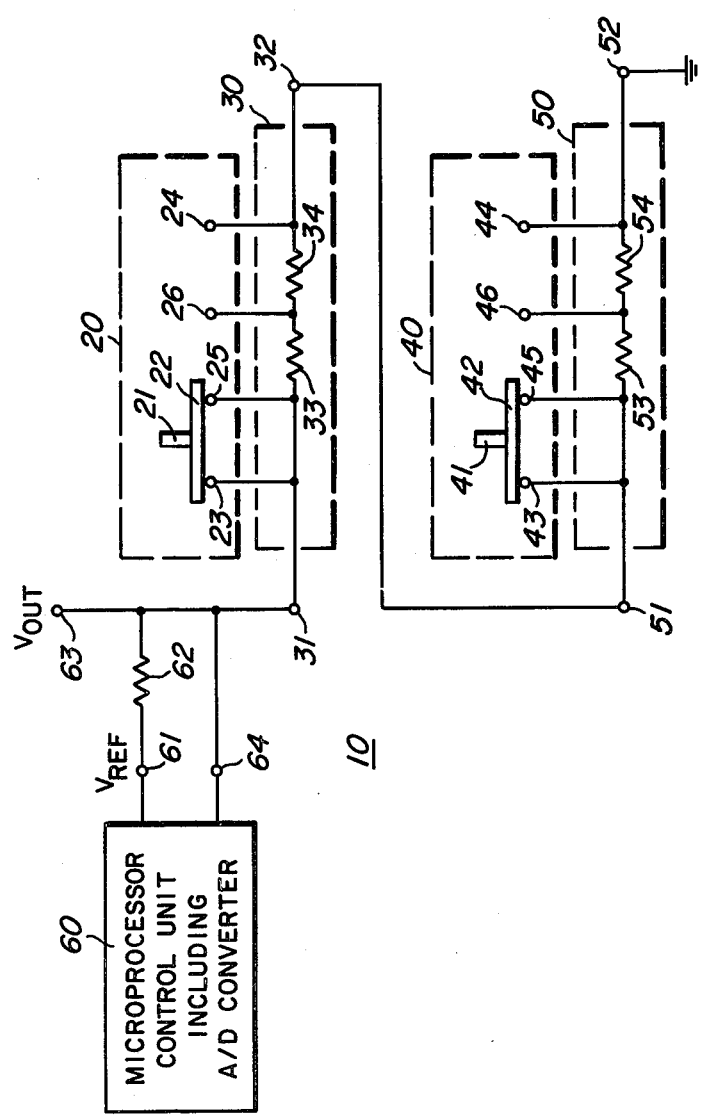

DUAL SLIDE SWITCH VOLTAGE ENCODER

BACKGROUND OF THE INVENTION

The present invention relates to the field of analog voltage encoders which produce a series of analog voltages representative of a corresponding series of different logic states.

Generally, in order to generate a plurality of different analog voltages which are representative of different logic states a rotary switch is used in which each mechanical position of the rotary switch corresponds to a different logic state. Circuitry is connected to the rotary switch such that a series of equal increment voltages are produced at an output terminal in response to moving the single manual actuator of the rotary switch through each of its mechanical positions. Such rotary switches are relatively expensive especially when a large number of rotary mechanical positions must be provided in order to generate a corresponding number of different analog voltages.

Slide switches have been used in some voltage encoders, but generally these slide switches have not interreacted with each other so as to produce a plurality of analog voltages at a single voltage encoder output terminal while minimizing the number of switches being used and the over all expense of the voltage encoder apparatus.

SUMMARY OF THE INVENTION

In one embodiment of the present invention an encoder is provided which generates any one of a plurality of discrete analog signals. The encoder comprises, source means for providing a predetermined analog reference signal having a magnitude, first multiposition switch means with a first manual actuator having at least two stable mechanical positions; first circuit means associated with and coupled to said first switch means, said first circuit means having input and output terminals and providing a series of different predetermined resistances between said first input and output terminals wherein each resistance corresponds to each mechanical position of said first actuator; second multiposition switch means with a second manual actuator having at least two stable mechanical positions, said second manual actuator independently operable with respect to said first manual actuator; second circuit means associated with and coupled to said second switch means, said second circuit means having input and output terminals and providing a series of different predetermined resistances between said second input and output terminals wherein each resistance corresponds to each mechanical position of said second actuator; said first and second circuit means coupled to each other and at least one of said first and second switch means coupled to said source means; and an encoder output terminal coupled to at least one of said first and second circuit means, said predetermined resistances provided by said first and second switch and circuit means being interrelated such that a plurality of predetermined analog output signals related to said reference signal and having substantially equal increments in magnitude therebetween are provided at said encoder output terminal in response to the combination of each mechanical position of said first manual actuator with each mechanical position of said second manual actuator, whereby said first and second switch and circuit means provide an inexpensive apparatus for developing any one of a plurality of discrete analog signal at a single output terminal representative of a plurality of different logic states by utilizing a single reference signal.

Preferably, two three position slide switches are utilized wherein each slide switch, along with an associated circuit means comprising two discrete resistors and a short circuit, produces a series of different resistances having equal increments therebetween. The two slide switches and their associated circuit means are effectively connected in series with each other and the equal resistive increments produced by one of the slide switches and its associated circuit means are equal to the product of the equal resistive increments of the other slide switch and its associated circuit means times the number of different mechanical positions of the other slide switch means. For the case of a three position slide switch this number of positions is equal to three.

The two series connected slide switches effectively form a variable resistance which is connected with a fixed value source resistance to form a voltage divider for a reference voltage provided by a microprocessor control unit. The output of this voltage divider is provided at a single output terminal which is coupled to an analog to digital converter which converts the analog voltages produced by the voltage encoder of the present invention into different digital values representative of different logic states. The magnitude of the source resistance is selected so as to maximize the smallest magnitude increment in the series of analog voltages produced by the voltage divider. By series connecting two independently operable slide switches and utilizing them in the above described configuration, an inexpensive voltage encoder is provided which produces a series of different magnitude analog voltages having substantially equal increments therebetween wherein these analog voltages can be representative of different discrete logic states.

BRIEF DESCRIPTION OF THE DRAWING

For a more complete understanding of the present invention reference should be made to the drawing, in which: an electrical schematic diagram of a voltage encoder for a microprocessor is illustrated.

DESCRIPTION OF THE PREFERRED EMBODIMENT

In the drawing, a voltage encoder 10 is illustrated which basically comprises first and second three position slide switches 20 and 40, respectively, which are shown dashed and effectively connected in series in a manner to be subsequently described. The slide switches 20 and 40 each comprise manual actuators 21 and 41 which control the mechanical positions of associated sliding contact conductors 22 and 42, respectively. Each switch 20 and 40 has input and output end terminals 23 and 24 and 43 and 44, respectively, as well as internal terminals 25 and 26 and 45 and 46, respectively. Each slide switch has three stable mechanical positions of its actuator and contact bar, and a number of internal terminals equal to one less than the total number of mechanical positions of the manual actuator. In each mechanical position of the manual actuator and sliding contact bar, each switch is operable to short together at least two of its terminals including at least one of its internal terminals. For example, the slide switch 20 is shown in the drawing with its manual actuator 21 in a first mechanical position in which the terminals 23 and 25 are shorted out by the contact bar 22. In the second mechanical position of the slide switch 20, the terminals 25 and 26 would be shorted out by the slide bar 22, whereas in the third mechanical position the terminals 26 and 24 would be shorted together by the contact bar. The operation of the slide switch 40 is identical, and the manual actuators 21 and 41 are each independently operable.

The slide switches 20 and 40 are each coupled to an associated circuit means 30 and 50, respectively, which are shown dashed in the drawings. Each of the circuit means 30 and 50 consists of input terminals 31 and 51, output terminals 32 and 52 and resistors 33 and 34 and 53 and 54, respectively. The input terminals 31 and 51 are connected to the output terminals 32 and 52 through the series connection of the resistors 33 and 34 and 53 and 54, respectively. The circuit means 30 provides a short circuit between the terminals 23 and 25 together while placing the resistor 33 between the terminals 25 and 26, and the resistor 34 between the terminals 26 and 24. The circuit means 50 has an identical configuration in that it shorts out the terminals 43 and 45 and connects the resistor 53 between the terminals 45 and 46, while connecting the resistor 54 between the terminals 46 and 44.

A microprocessor control unit 60 is illustrated in block form and includes an analog to digital (A/D) converter. The control unit 60 provides a reference voltage $V_{ref}$ at a terminal 61 which is connected through a fixed magnitude source resistor 62 to an encoder output terminal 63 that is directly connected to both the input terminal 31 and an input terminal 64 of the control unit 60. The terminal 64 provides input voltages to the analog to digital converter inside of the microprocessor control unit. The output terminal 32 of the first circuit means 30 is directly connected to the input terminal 51 of the second circuit means 50, and the output terminal 52 is directly connected to ground.

Essentially, the microprocessor control unit 60 provides a fixed magnitude analog reference voltage at the terminal 61. The resistor 62 together with the first and second switch and circuit means comprise a voltage divider circuit in which the resistance between the terminals 31 and 52 is essentially a variable resistance which is controlled by the mechanical positions of the actuators 21 and 41. By stepping these manual actuators through each of the various combinations of mechanical positions, nine different variable resistances are provided between the terminals 31 and 52, and these resistances produce nine discrete analog voltage magnitudes as the terminals 63 and 64 which are representative of nine different logic states corresponding to the various mechanical positions of the actuators. This can be represented by the following equation:

$$V_{out} = \frac{R}{R + R_{62}} (V_{ref}); \quad 1.$$

where $R_{62}$ represents the magnitude of the source resistor 62, $V_{ref}$ represents the magnitude of the fixed magnitude analog voltage provided at the terminal 61, $V_{out}$ represents the magnitude of the variable analog voltage produced at the terminals 63 and 64, and R represents the variable resistance provided between the terminals 31 and 52 by the series connected slide switches 20 and 40.

The present invention contemplates that each of the circuit means 30 and 50 provides a series of different predetermined resistances between their input and output terminals wherein each resistance corresponds to each mechanical position of the manual actuators of the slide switches associated with these circuit means. In other words, for each of the three different mechanical positions of the actuator 21, for example, a different resistance is produced between the terminals 31 and 32. The present invention also contemplates that these different resistances will form an equal increment series of different resistances. In the first mechanical position of the actuator 21, the resistance between the terminals 31 and 32 is equal to the sum of the magnitudes of the resistors 33 and 34, while in the second mechanical position it is equal to the magnitude of the resistor 34 and in the third mechanical position it is equal to the magnitude of the resistor 33. To provide an equal increment ($I_1$) series of different resistances for each of the mechanical positions of the actuator 21, this requires that the magnitude of the resistor 33 be equal to this increment $I_1$ whereas the magnitude of the resistor 34 must be twice the increment $I_1$.

The present invention also contemplates the identical operation of the slide switch 40 and circuit means 50. Thus the magnitude of the resistor 53 must be equal to an increment $I_2$ produced by these elements, whereas the magnitude of the resistor 54 must be twice the increment $I_2$.

The present invention also contemplates providing a series of resistances between the terminals 31 and 52 which represents a series of equal increment resistances produced in response to the various combinations of the mechanical positions of the actuators 21 and 41. This requires that the equal resistance increment $I_1$ provided by the first switch means 20 and first circuit means 30 must be equal to the product of the equal resistance increment $I_2$ provided by the switch means 40 and the circuit 50 times the number of mechanical positions (3) of the second switch means manual actuator 41. Thus if the equal increment $I_2$ is assumed to have a value of 1, then the magnitudes of the resistors 53, 54, 33 and 34 are 1, 2, 3 and 6. For these resistive values nine distinct resistances will be produced between the terminals 31 and 52 which will vary from 4 through 12 by increments of 1 in response to the various combination of the positions of the actuators 21 and 41.

The present invention, as illustrated in the preceeding paragraph, contemplates providing a series of equal increment different resistances between the terminals 31 and 52 wherein each of these different resistances is produced in response to one of the nine different combinations of mechanical positions of the manual actuators 21 and 41. In this manner, the encoded analog voltages produced at the terminals 63 and 64 in response to the different resistances produced between the terminals 31 and 52 will also have substantially equal increments in magnitudes therebetween. This result can be seen from the preceeding equation number 1. Certainly if the magnitude of the resistor 62 is substantially larger than any of the resistances provided between the terminals 31 and 52 (corresponding to the magnitude R), then equal increments of analog voltage will be produced in response to equal increments of resistance for the quantity R. Even if the magnitude of the resistor 62 is not substantially larger than the resistance R, the fact that the resistance R is varied in equal increments will provide for producing analog voltages at the terminals 63 and 64 that vary in substantially equal increments as long as the magnitude of the resistor 62 is not substantially less than the values of the resistance R.

The present invention contemplates selecting the magnitude of the resistor 62 such that the magnitude of the smallest voltage step (increment) produced by altering the mechanical positions of the actuators 21 and 41 from one set of mechanical positions to a different set of mechanical positions is maximized. Equation 2 below states the general relationship defining the size of an analog voltage step produced by the present invention;

$$\Delta V_{out} = \left( \frac{R_a}{R_a + R_{62}} - \frac{R_b}{R_b + R_{62}} \right)(V_{ref}); \quad 2.$$

where $R_a$ represents one value of a resistance between the terminals 31 and 32 produced by the present invention, and $R_b$ represents the next value of resistance produced by the present invention.

For the circuit shown in the drawing, the smallest analog voltage step will occur when the highest resistance is provided between the terminals 31 and 52 by the switches 20 and 40, and then the positions of the actuators 21 and 41 are subsequently changed to produce the next highest resistance. If the values of the highest and next highest resistance are known, then by taking the derivative of the voltage step as defined in equation 2 with respect to the magnitude of $R_{62}$ and setting the derivative equal to zero, the optimum value of the resistor 62 can be calculated which will maximize the smallest voltage step produced by the circuit shown in the drawing. If this is done, it can be shown that in order to maximize the smallest voltage step produced by the present invention, the magnitude of the resistor 62 should be equal to the square root of the product of the highest resistance and the next highest resistance provided between the terminals 31 and 52.

If the circuit shown in the drawing is slightly changed such that the resistor 62 is connected between the terminal 63 and ground, and the switches 20 and 40 are series connected between the terminals 61 and 63, again a voltage divider encoder circuit will be produced which functions similarly to that shown in the drawing. However, for this altered circuit the magnitude of the resistor 62 which maximizes the smallest voltage step produced by this altered circuit can be shown to be equal to the square root of the product of the smallest value of resistance produced between the terminals 31 and 52 times the next smallest resistance.

In summary, the present invention has provided a voltage encoder circuit in which two three position slide switches have been effectively connected in series along with their associated circuit means so as to produce a series of different discrete resistances wherein each resistance corresponds to one of the various mechanical positions of the actuators of the slide switches. This series of different resistances can be made to have equal increments in resistance according to the teachings of the present invention, and this aids in producing a series of analog voltages having substantially equal voltage increments therebetween in response to each set of different combinations of positions of the actuators of the slide switches. A fixed source resistance is utilized with the two series connected slide switches to form a voltage divider network that produces substantially equal increment analog voltages, and the magnitude of the fixed value source resistance is selected to maximize the smallest voltage step produced according to the teachings of the present invention.

In the preferred embodiment of the present invention shown in the drawing, the terminals 23 and 25 (and 43 and 45) are shown to be shorted out by the circuit means 30 (50). In this manner, the switch means and its associated circuit means can produce three different equal increment resistances by utilizing only two resistors. Of course these short circuits could be replaced by additional discrete resistors and the teachings of the present invention could be identically followed. By utilizing these short circuits the number of required resistors is decreased thus decreasing the cost of the voltage encoder.

While I have shown and described specific embodiments of this invention, further modifications and improvements will occur to those skilled in the art. All such modifications which retain the basic underlying principals disclosed and claimed herein are within the scope of this invention.

I claim:

1. An encoder for providing any one of a plurality of predetermined discrete analog signals, said encoder comprising:

source means providing a predetermined analog reference signal having a magnitude;

first multiposition switch means with a first manual actuator having at least three stable mechanical positions;

first circuit means associated with and coupled to said first switch means, said first circuit means having input and output terminals and providing a series of different predetermined resistances between said first input and output terminals wherein each resistance corresponds to each of said mechanical positions of said first actuator;

second multiposition switch means with a second manual actuator having at least two stable mechanical positions, said second manual actuator independently operable with respect to said first manual actuator;

second circuit means associate with and coupled to said second switch means, said second circuit means having input and output terminals and providing a series of different predetermined resistances between said second input and output terminals wherein each resistance corresponds to each of said mechanical positions of said second actuator;

said first and second circuit means coupled to each other, and at least one of said first and second switch means coupled to said source means; and an encoder output terminal coupled to at least one of said first and second circuit means;

said predetermined resistances provided by said first and second switch and circuit means being interrelated such that a plurality of predetermined analog output signals related to said analog reference signal and having substantially equal increments in magnitude therebetween are provided at said encoder output terminal in response to the combination of each of said mechanical positions of said first manual actuator with each of said mechanical positions of said second manual actuator, whereby said first and second switch and circuit means provide an inexpensive apparatus for developing any one of a plurality of discrete analog signals at a single output terminal representative of a plurality of different logic states by utilizing a single analog reference signal, wherein each of the series of different resistances provided by the first and second circuit means have equal increments therebetween and the increment of the first series of resistances is substantially equal to the product of the increment of the second series of resistances times the number of said mechanical positions of said second switch means manual actuator.

2. An encoder as claimed in claim 1 wherein said first and second circuit means are connected in series with said first output terminal coupled to said second input terminal.

3. An encoder as claimed in claim 2 wherein said first and second actuators each have at least three stable mechanical positions.

4. An encoder as claimed in claim 3 wherein said plurality of predetermined output signals are equal in number to the product of the number of said first and second actuator mechanical positions.

5. An encoder as claimed in claim 4 wherein said encoder includes a fixed value source resistor coupled between said source means and said first input terminal.

6. An encoder as claimed in claim 5 wherein said reference signal is a reference voltage, said encoder output terminal corresponds to said first input terminal, and said first and second circuit means and said source resistor comprise a voltage divider circuit providing discrete analog voltages at said output terminal as said plurality of output signals.

7. An encoder as claimed in claim 6
wherein said source resistance is approximately equal to the square root of the product of two adjacent values of resistance provided by said first and second circuit means
wherein these two adjacent resistances are at the end of the series of resistances provided by the series combination of the first and second circuit means.

8. An encoder as claimed in claim 6 wherein each of said first and second switch means comprise a multiposition slide switch with input and output end terminals and a number of internal terminals equal in number to one less than the number of stable positions of the manual actuator of the slide switch, each slide switch operable to short together at least two of its terminals, including at least one of its internal terminals, for each mechanical position of its manual actuator.

9. An encoder as claimed in claim 8 wherein each of said first and second circuit means comprise a plurality of resistances, each of said circuit means providing a different resistance between each terminal of its associated switch means and all other terminals of said associated switch means, these different resistances forming an equal increment series of different resistances for each individual circuit means.

10. An encoder as claimed in claim 9 wherein the magnitude of said source resistance is such that a substantially maximum possible voltage step is provided when the positions of the first and second actuators are moved from the positions which provide the highest resistance between the first input and second output terminals and the positions which provide the next highest resistance.

11. An encoder as claimed in claims 9 or 10 wherein said source resistance magnitude is approximately equal in magnitude to the square root of the product of the highest resistance between the first input and second output terminals provided by said first and second switch means and circuit means and the next highest resistance provided thereby.

12. An encoder as claimed in claim 9 wherein the magnitude of said source resistance is such that a substantially maximum possible voltage step is provided when the positions of the first and second actuators are moved from the positions which provide the lowest resistance between the first input and second output terminals and the positions which provide the next lowest resistance.

13. An encoder as claimed in claim 9 or 12 wherein the magnitude of the source resistance is approximately equal to the square root of the product of the lowest resistance provided between said first input and second output terminals by said first and second switch means and circuit means and the next lowest resistance.

14. An encoder as claimed in claim 9 wherein the magnitude of said source resistance is substantially equal to the magnitude which maximizes the smallest increment of said substantially equal increments of said plurality of analog signals.

15. An encoder as claimed in claim 9 wherein one of the different resistances provided by each of the first and second circuit means between said terminals of its associated switch means is substantially zero.

16. An encoder as claimed in claim 9 which includes an electronic control unit and wherein said encoder output terminal is coupled to said electronic control unit which includes an analog to digital converter, and wherein said reference voltage is provided by said electronic control unit, and said encoder output terminal provides input voltages to said analog to digital converter.

17. An encoder as claimed in claim 16 wherein said electronic control unit is part of a microprocessor computer.

* * * * *